United States Patent
Kisakibaru

Patent Number: 5,928,077
Date of Patent: Jul. 27, 1999

[54] CLEAN ROOM FOR MANUFACTURING OF SEMICONDUCTOR DEVICE

[75] Inventor: Toshiro Kisakibaru, Kanagawa, Japan

[73] Assignee: Sony Corporation, Tokyo, Japan

[21] Appl. No.: 08/918,061

[22] Filed: Aug. 25, 1997

[30] Foreign Application Priority Data

Aug. 28, 1996 [JP] Japan .................................... 8-226370

[51] Int. Cl.⁶ ............................................. F24F 7/06
[52] U.S. Cl. ............................................. 454/187; 414/940
[58] Field of Search ........................... 454/187; 414/235, 414/940

[56] References Cited

U.S. PATENT DOCUMENTS

| | | | |
|---|---|---|---|
| 4,826,360 | 5/1989 | Iwasawa et al. | 414/217 X |
| 4,923,352 | 5/1990 | Tamura et al. | 454/187 X |
| 5,058,491 | 10/1991 | Wiemer et al. | |

FOREIGN PATENT DOCUMENTS

| | | | |
|---|---|---|---|
| 60-164143 | 8/1985 | Japan | 454/187 |
| 63-80146 | 4/1988 | Japan | 454/187 |
| 5-205988 | 8/1993 | Japan | 454/187 |

Primary Examiner—Harold Joyce
Attorney, Agent, or Firm—Hill & Simpson

[57] ABSTRACT

There is provided a clean room for manufacturing of semiconductor device which has further enhanced the transferring capability responding to the request for short Turn Around Time. In this clean room for manufacturing of semiconductor device, a manufacturing facility comprising various manufacturing apparatuses and measuring apparatuses for manufacturing semiconductor device is arranged in the manufacturing space on the floor, the clean air is blown from the ceiling side of the manufacturing space, the air is then returned to the area under the floor via the ventilating aperture formed at the floor for circulating the air. The transfer route of the transferring system for transferring precursors of semiconductor device between each manufacturing facility is provided in the air returning area under the floor provided to return the air in the manufacturing space. Feeding of the precursors between the transferring system and manufacturing space can be executed through the aperture formed on the floor.

5 Claims, 3 Drawing Sheets

5,928,077

CLEAN ROOM FOR MANUFACTURING OF SEMICONDUCTOR DEVICE

BACKGROUND OF THE INVENTION

1. Field of the Invention

The present invention relates to a clean room for manufacturing of semiconductor device having installed manufacturing facilities such as variety of manufacturing apparatuses and measuring apparatuses used to manufacture the semiconductor devices.

2. Description of the Related Art

Semiconductor devices are manufactured, as is well known, within a clean room having installed various manufacturing apparatuses used in various manufacturing processes (wet process, dry process, oxidation, lithography, ion implantation, etc.) and measuring apparatuses used for various measuring processes in testing for quality control. Examples of such clean room is described in the reference 1, CLEAN TECHNOLOGY, published by Japan Industrial Publication Inc., 1997, Vol. 7, No. 1 and the reference 2, Japan 300 mm Semiconductor Technology Conference (J300), 1996, December 3, 2nd Lecture "ICs Factory Design for 300 mm Wafer Line Standardizing Study P9 to 10".

In such a clean room, the manufacturing apparatuses and measuring apparatuses are usually installed. In other words, an automatic transferring system is installed for transferring precursors such as wafers which are uncompleted semiconductor devices between these manufacturing facilities.

FIG. 1A and FIG. 1B respectively show examples of clean rooms to which the automatic transferring system of this type has been introduced. In these figures, the reference numeral 1 denotes a clean room. In this clean room 1, many manufacturing facilities, each of which is composed of the manufacturing apparatuses and measuring apparatuses, are provided as shown in the plan view of FIG. 1A and a clean bay 3, which is the space allowing a worker to walk through and work therein, is provided in the front side of the manufacturing facility 2, namely in the precursor take-in/take-out side (not illustrated).

In this clean room 1, an air filter 4 is provided at the ceiling area as shown in the side sectional view of FIG. 1B, thereby the clean air is supplied, by means of a fan not illustrated, to the manufacturing space 5 in the clean room 1 passing through the air filter 4 from the rear side of the ceiling area, moreover the clean air having passed the manufacturing space 5 is caused to flow into an air returning area 6 under the floor passing through a ventilation aperture (not illustrated) formed at the floor and this air is circulated again to the rear side of the ceiling by means of the fan.

In such a clean room 1, the automatic transferring system described previously is composed of an overhead rail running type transferring apparatus and an Automated Guided Vehicle (AGV) 7. As shown in FIG. 1A and FIG. 1B, the overhead rail running type transferring apparatus is provided to transfer the precursors between the clean bays 3, 3, namely between the processes. This transferring apparatus is composed, as shown in FIG. 1B, of a running rail 8 provided high in the ceiling side and a carrier 9 running on this rail 8. The automated guided vehicle 7 travels, as shown in FIG. 1A, the route to reciprocally move the clean bay 3 from the side of the running rail 8, namely transfers the precursors within the process.

In addition, as shown in FIG. 1A, in such automatic transferring system, a stocker 10 is also arranged at the area just under the running rail 8 in order to once stock the precursors before having over the precursors to the automated guided vehicle 7 from the carrier 9.

In regard to manufacturing of semiconductor devices, small-kind and large-lot production system tends to be changed to the multi-kind and small-lot production system in recent years and the wafers are recently processed in unit of a small lot because the wafer diameter is increased and moreover a request for short TAT (Turn Around Time) is raised and thereby the precursors are recently transferred in a small lot. As explained above, since the precursors are transferred in a small lot, the transfer frequency of the precursors in the clean room 1 is also increasing in these years.

Therefore, various methods are attempted to enhance the transferring capability responding to increase of transfer frequency and the request for short TAT. For example, in order to enhance the transferring capability, it has been attempted that the running rail 8 is doubled or quadrupled or more multiplexed to realize multiple transfer loop of the running rail 8. Moreover in order to enhance the transferring capability in the process, it has also been attempted that a high speed automated guided vehicle is introduced.

However, enhancement of the transferring capability is more and more required under the condition that the requirement for short TAT is still further increased.

But, since the precursors are transferred through the running of the automated guided vehicle 7 and the carrier 9 within the manufacturing space 5 where many manufacturing facilities 2 are installed, the automatic transferring system of the related art cannot shorten the transferring distance due to limitation in the transfer route and moreover is difficult to further enhance its transferring capability because occupied area of the automatic transferring system in the clean room 1 is increasing.

OBJECT AND SUMMARY OF THE INVENTION

The present invention has been proposed considering the background explained above and therefore it is an object of the present invention to provide a clean room for manufacturing of semiconductor device which has further enhanced the transferring capability responding to the request for short TAT, etc.

As will be described in the claim 1, in the clean room for manufacturing of semiconductor device where a manufacturing facility comprising various kinds of manufacturing apparatuses and measuring apparatuses for manufacturing semiconductor devices is arranged in the manufacturing space on the floor, the clean air is blown from the ceiling side of the manufacturing space, the air is caused to flow into the area under the floor via the ventilating aperture formed at the floor and this air is then circulated to the rear side of the ceiling, the transfer route of the transferring system for transferring the precursors of semiconductor devices between the manufacturing facilities is provided in the air returning area under the floor provided to return the air in the manufacturing space and thereby the precursors are exchanged between the transferring system and the manufacturing space via the aperture formed at the floor.

According to this clean room for manufacturing of semiconductor devices, since the transfer route of the transferring system to transfer the precursors of semiconductor devices is provided in the air returning area under the floor, a degree of freedom for transfer route may be increased, the transfer time can be shortened, namely the transferring capability can be enhanced by introducing, for example, the transfer route passing through the shortest distance between the manufacturing facilities and moreover the short TAT can be realized.

Moreover, since the transfer route is isolated from the manufacturing space by means of the floor, the working area of a worker is naturally different from that of the transferring system and thereby an accident such as collision between worker and transferring system can be eliminated and high speed transfer by the transferring system may be realized.

In addition, since the transfer route is provided in the air returning area under the floor, only a very small amount of dust or contaminating substance, etc. will flow into the manufacturing space from the transferring system.

As will be described in the claim 2, since an auxiliary machinery installation area to which auxiliary machines such as a pump are installed is provided in the space under the floor which is shielded in the air flow from the air returning area, the air flow may be shielded between the auxiliary machine installing area and air returning area and thereby flow of various contaminants into the manufacturing space due to operation of the auxiliary machines such as exhaust gas from the auxiliary machines can be eliminated.

Moreover, as will be described in the claims 3 and 4, since a stocker is provided to once store the precursors transferred by the transferring system in the area just under or near the manufacturing facility in the air returning area and a lift is also provided to the stocker or the area near the stocker to lift the precursors received from the transferring system and stored therein up to the area on the floor via the aperture formed on the floor, the precursors may be transferred automatically to the manufacturing facility on the floor from the air returning area under the floor by means of the lift.

As will be described in the claim 5 and 6, since a stocker is provided to once store the precursors transferred by the transferring system at the area near the manufacturing facility in the manufacturing space and a lift is also provided to the stocker or to the area near the stocker to lift the precursors from the transferring system in the air returning area via the aperture and then once store the precursors in the stocker, the precursors may be automatically stored to the stocker from the air returning area.

Moreover, as will be described in the claims 7 and 8, since a lift is provided in direct to the transferring system to once receive the precursors on the floor to move downward to the area under the floor and to lift the precursors received on the transferring system to the area on the floor, it is no longer required to provide the stocker in the air returning area and thereby a degree of freedom of the transfer route can be enhanced as much.

In addition, when the lift is provided in direct to the transferring system, as will be described in the claims 9 and 10, a take-in mechanism is provided at least one manufacturing facility to take the precursors into the facility to cause the lift to make access in direct to the take-in mechanism to handle in direct the precursors to the take-in mechanism. Thereby, the precursors may be transferred in direct to the manufacturing facility including the take-in mechanism from the transferring system and moreover the precursors may be handed over quickly between the transferring system and manufacturing facility, shortening the time required by the processes from transfer to process by the manufacturing facility.

In addition, as will be described in the claims 11 and 12, since a take-in mechanism is provided to at least one manufacturing facility to take the precursors into the facility and a lift is also provided to the take-in mechanism or to the area near the take-in mechanism to lift the precursors from the transferring system in the air returning area via the aperture and to take the precursors into the take-in mechanism, the precursors may be handed over in direct, by means of the lift, to the manufacturing facility via the take-in mechanism from the transferring system and thereby transfer of precursors may be done quickly between the transferring system and the manufacturing facility to shorten the time required by the processes from the transfer to the process of precursors.

BRIEF DESCRIPTION OF THE DRAWINGS

Other objects and advantages of the present invention will be apparent from the following detailed description of the presently preferred embodiments thereof, which description should be considered in conjunction with the accompanying drawings in which.

DETAILED DESCRIPTION OF THE PREFERRED EMBODIMENT

Figure 1A:
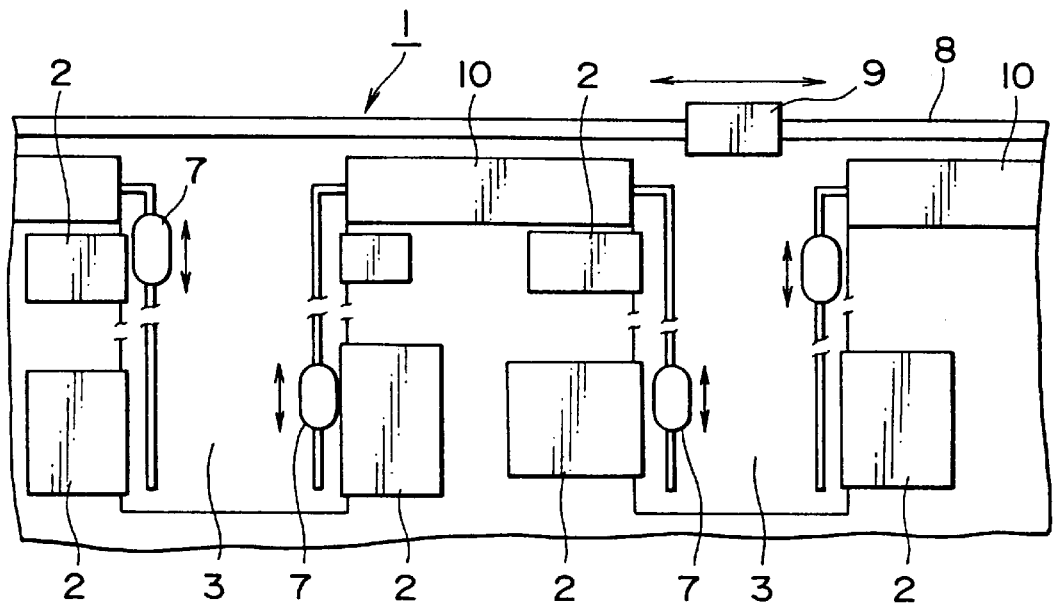
FIG. 1A is a plan view of the essential portion showing a schematic structure of an example of the clean room of the related art.
Figure 1B:
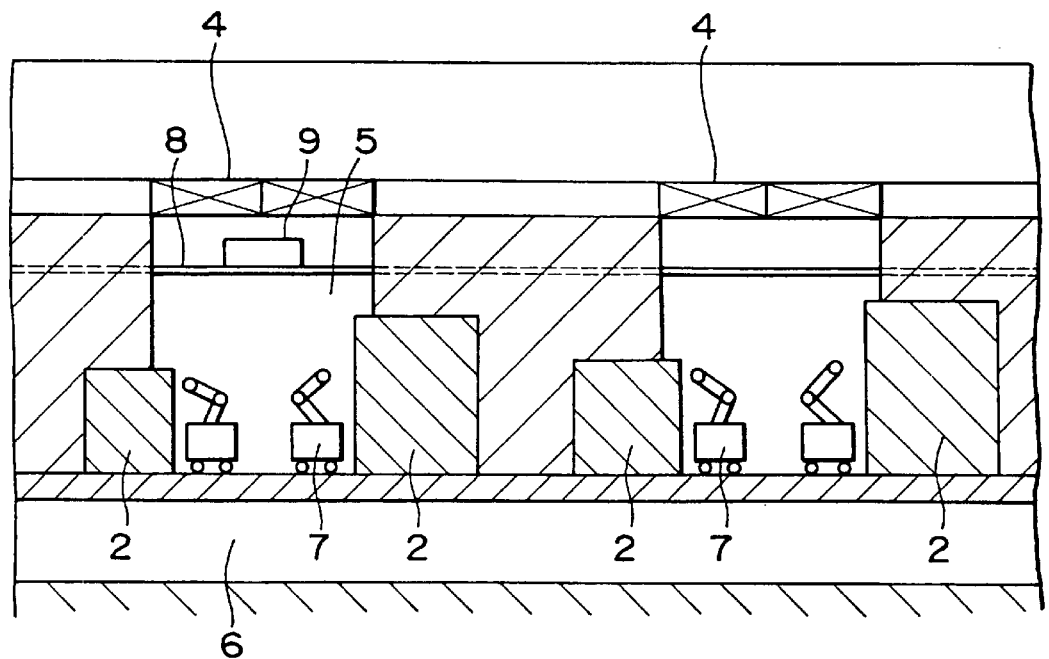
FIG. 1B is a side sectional view of the essential portion showing a schematic structure of an example of the clean room of the related art.
Figure 2A:
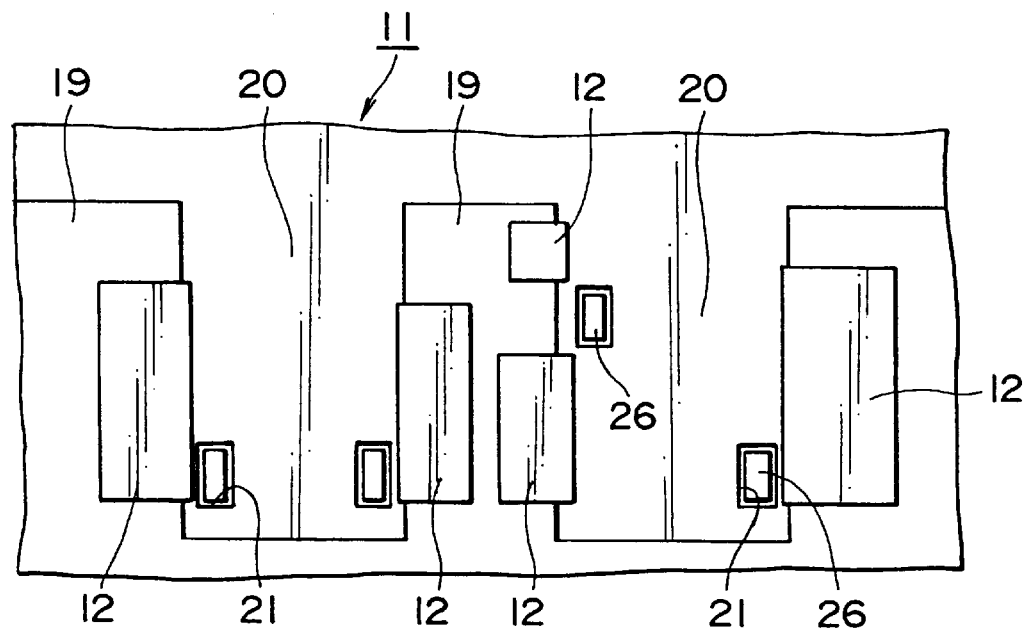
FIG. 2A is a plan view of the essential portion showing a schematic structure of a preferred embodiment of the clean room of the present invention.
Figure 2B:
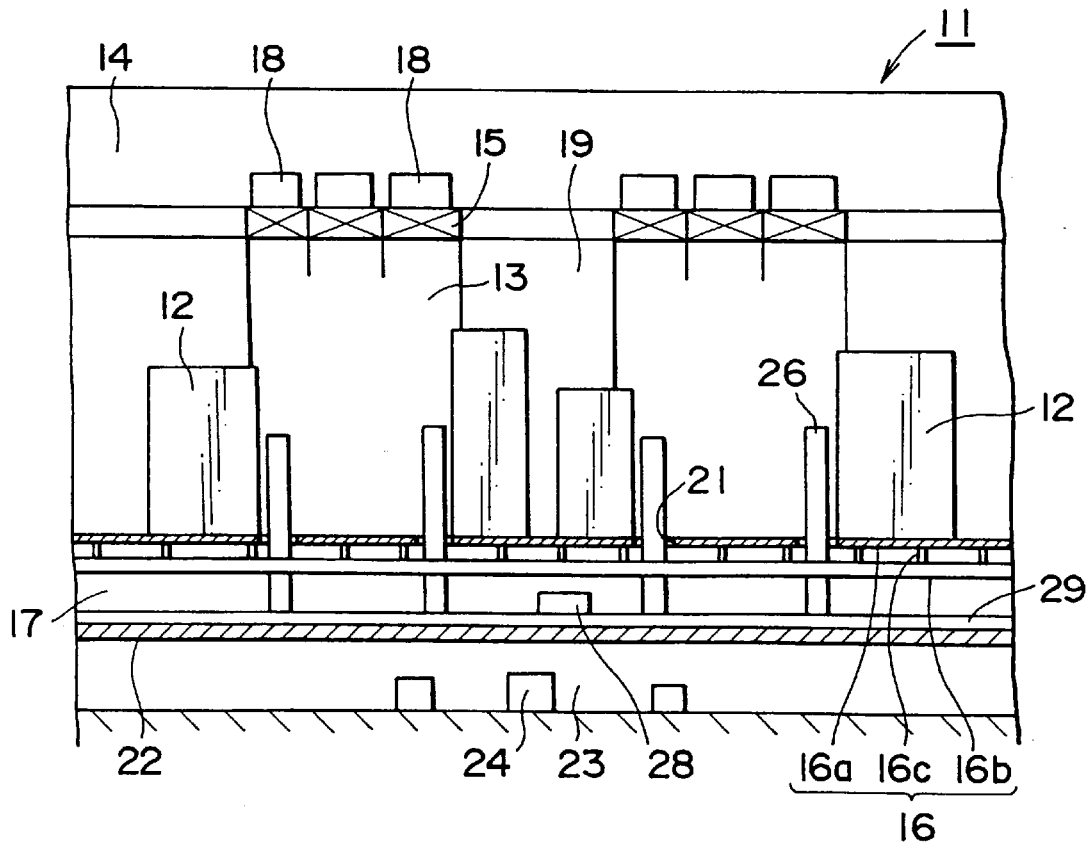
FIG. 2B is a side sectional view of the essential portion showing a schematic structure of a preferred embodiment of the clean room of the present invention.

FIG. 2A and FIG. 2B respectively show an embodiment of the clean room for manufacturing of semiconductor device of the present invention. In these figures, the reference numeral 11 denotes a clean room for manufacturing of semiconductor device (hereinafter abbreviated as clean room).

This clean room 11 is structured in such a manner that the manufacturing facility 12 comprising various manufacturing apparatuses and measuring apparatuses for manufacturing semiconductor devices is arranged in the manufacturing space 13, the clean air is blown into the manufacturing space 13 from the rear side 14 of the ceiling via a filter 15 and the air is then returned to the air returning area 17 under the floor via the ventilation aperture formed to the floor 16 to circulate the air.

Namely, in this example, the fan 18 is provided above the filter 15, the floor 16 includes the floor surface 16*a* formed of a punching metal on which many through holes (air ventilating means) are formed and moreover a separating means 19 isolating the manufacturing space 13 is provided with the air ventilation path (not illustrated). The air blown by the fan 18 is cleaned by the filter 15, then introduced to the manufacturing space 13, supplied to the air returning area 17 passing through the floor surface 16*a* and is then circulated to the rear surface 14 of the ceiling passing the air ventilation path in the separating means 19.

Here, the floor 16 is structured by arranging the floor surface 16*a* on the beams 16*b* provided in the clean room 11 under the condition that the floor surface is supported by the supporting members 16*c* . . . . Moreover, the separating means 19 separates the clean bay 20 which will become the working space and the manufacturing facility 12 is accommodated in the separating means 19 with its front surface side projected to or in contact with the clean bay 20.

Here, at the floor surface 16a in each clean bay 20, an aperture 21 is formed at the area near the front surface of each manufacturing facility 12. The aperture 21 is used, as will be explained later, to move downward the precursors completing the processing in the manufacturing facility 12 or move upward on the floor the precursors transferred under the floor . For this purpose, the setting plate of the lift described later is caused to move upward or downward between the areas on the floor and under the floor passing the aperture 21.

The air returning area 17 is formed by the space between the floor surface 16a and the separating floor 22 provided under the floor surface and the auxiliary machine setting area 23 is formed under the air returning area 17, namely under the separating floor 22. The auxiliary machine setting area 23 is the space shielded in the air flow from the air returning area 17 by means of the separating floor 22 and auxiliary machines 24 incorporated to the manufacturing facility 12 such as a pump, a power supply box and a transformer are installed in this area. The auxiliary machine 24 is connected to the corresponding manufacturing facility 12 via the piping or wiring not illustrated. These piping and wiring are extended, for example, into the manufacturing space 13 passing within the external wall defining the clean room 11 and are then connected to the corresponding manufacturing facility 12 so that air flow is not generated between the auxiliary machine setting area 23 and air returning area 17.

Figure 3:
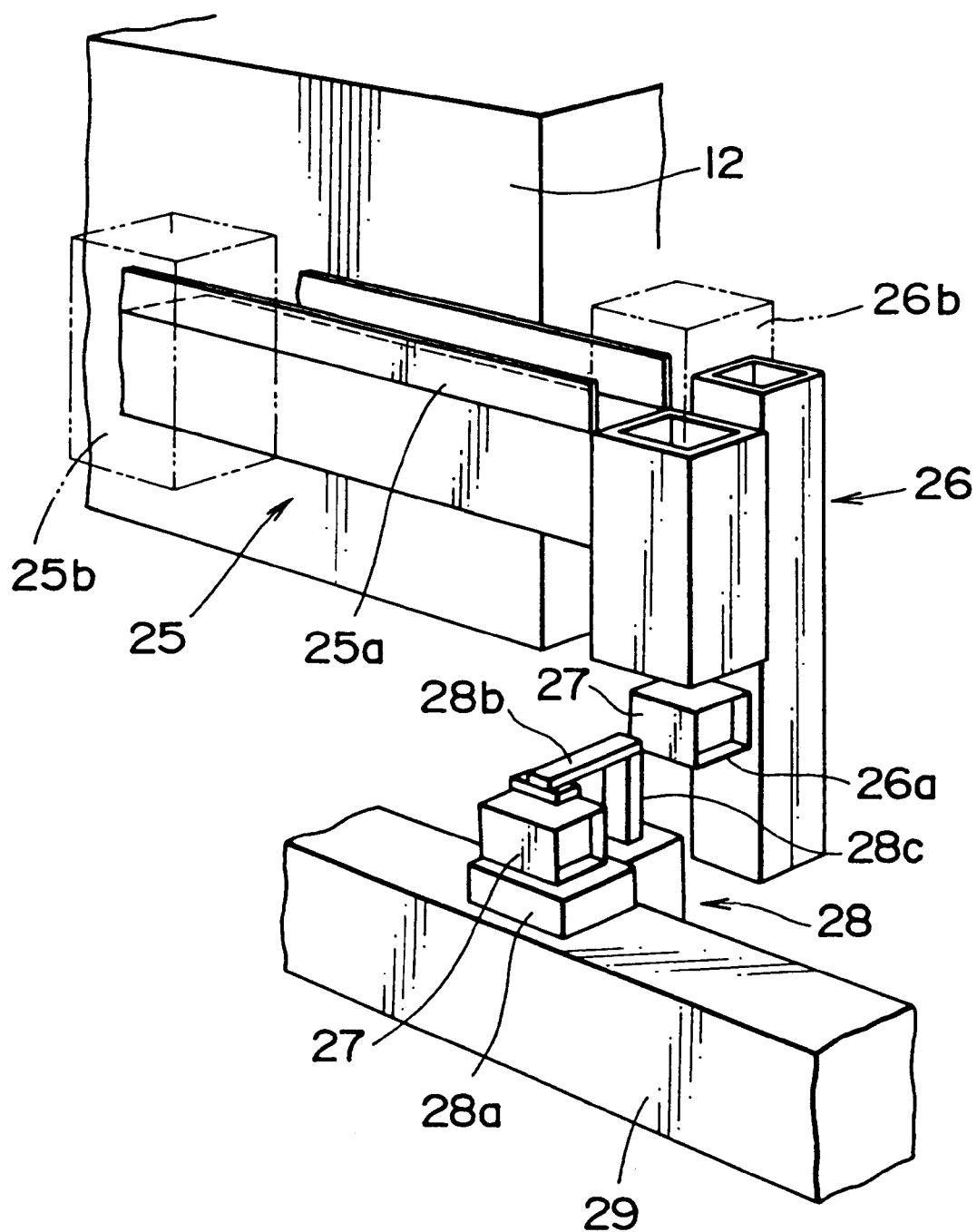
FIG. 3 is a perspective view for explaining a transferring system, a lift and a take-in mechanism.

The manufacturing facility 12 is provided with, at its front surface side, namely in the clean bay 20, a tanke-in mechanism 25 to take the precursors into the manufacturing facility 12 as shown in FIG. 3 and a lift 26 is also provided to move upward and transfer the precursors at the area near the take-in mechanism 25. The lift 26 is provided on the separating floor 22 of the air returning area 17 and is extended into the manufacturing space 13 through the aperture 21 of the floor 16. This lift 26 comprises a setting plate 26a for setting a container 27 containing precursors, a lifting mechanism (not illustrated) for lifting this setting plate 26a and a feeding mechanism 26b for sending the container 27 to the take-in mechanism 25 from the setting plate 26a at the highest listed position of the lifting mechanism.

The take-in mechanism 25 is provided with a conveyor 25a for connection with the feeding mechanism 26b at the highest lifted position of the lift 26 and a guiding mechanism 25b for guiding the container 27 to the precursor take-in aperture (not illustrated) of the manufacturing facility 12 from the predetermined position on the conveyor 25a and taking the precursors into the take-in aperture.

With the structure of such lift 26 and take-in mechanism 25, the lift 26 can make direct access to the take-in mechanism to feed in direct the precursors to the take-in mechanism.

In the air returning area 17, the transfer route of the transferring system 28 is formed to transfer the precursors between the manufacturing facilities 12. The transfer route is formed of the transfer rail 29 shown in FIG. 2 and the transferring system 28 runs on this transfer rail 29 to travel the predetermined transfer route. The transferring system 28 is also provided with a well known self-running means (not illustrated) consisting, for example, of a motor and a vehicle running in conjunction with the motor to travel on the transfer rail 29. This transferring system 28 comprises a setting means 28a for setting the container 27 containing precursors, a holding arm 28b for holding the container 27 on the setting means 28a and a rotating arm 28c for rotating the holding arm 28b.

Depending on the structure explained above, the transferring system 28 travels up to the predetermined position near the lift 26 and stops here as shown in FIG. 3, rotates the holding arm 28b on the setting means 27 with the rotating arm 28c while holding the container 27 on the setting means 28a with the holding arm 28b and then feeds the container 27 on the setting plate 26a of the lift 26. Moreover, on the occasion of receiving, on the contrary, the container 27 from the lift 26, the transferring system 28 holds the container placed on the setting plate 26a with the holding arm 28b depending on the operation of the rotating arm 28c and then feeds the container onto the setting means 28a.

The running operation of the transferring system 28 and feeding operation of the container 27 are remote-controlled, for example, from a control room provided outside the clean room 11 or automatically controlled depending on the preset control method.

As explained above, in this clean room 11, transfer of precursors is realized by the transferring system 28 for which the transfer route is formed in the air returning area 17 under the floor and feeding of precursors to the manufacturing facility 12 from the transferring system 28 is executed in direct via the lift 26 and take-in mechanism 25 without temporary storing of the precursors in the stocker different from the related art.

Therefore, since the transfer route is provided, in this clean room 11, in the air returning area 17 under the floor in which the manufacturing facility 12 is never installed and a worker does not enter, the degree of freedom of the transfer route can be enhanced and the transfer route passing the shortest distance, for example, between the manufacturing facilities 12, 12 can be employed, that is, a quite unique and novel transfer mode may be constituted, namely, processes are divided into small groups or small groups having a large frequency of the transfer between the manufacturing facilities are formed, small independent transfer loops are formed in such small groups and the transfer route is formed by combining a plurality of small transfer loops, in place of the transfer mode where the process-to-process transfer route for transferring precursors between the processes is formed and the in-process transfer route for transferring precursors within the process are formed like the related art and the precursors are transferred between these routes via the stocker.

Moreover, since the air returning area 17 may be used effectively by providing the transfer route in the air returning area 17 under the floor, the space application efficiency of the clean room 11 as a whole can be realized to improve the manufacturing efficiency of the semiconductor device.

In addition, since the auxiliary machinery installation area 23 which is the space shielded in the air flow from the air returning area 17 is provided under the air returning area 17, flowing of various contaminants due to the operation of auxiliary machines such as exhaust gas from the auxiliary machine 24 can be controlled, resulting in further improvement of the cleaning degree in the manufacturing space 13.

Further, since the take-in mechanism 25 is provided in the manufacturing facility 12 and the lift 26 is also provided in the area near the take-in mechanism 25, the lift 26 can feed the precursor in direct to the manufacturing facility 12 via the take-in mechanism 25 from the transferring system 28. Therefore, quick feeding of the precursors can be realized between the transferring system 28 and manufacturing facility 12 to shorten the time required by the processes from the transfer to the process by the manufacturing facility 12.

In above embodiment, the precursors are fed in direct from the transferring system 28 and then lifted by the lift 26, but when it is requested that a large amount of precursors are lifted at a time to the manufacturing space 13 to process a large amount of precursors at a time depending on the kind of the manufacturing facility 12 or when it is requested to further enhance the transferring efficiency, it is also possible that the stocker is provided at the area just under or near the manufacturing facility 12 and a lift similar to that of FIG. 3 may be provided in direct to the stocker or to the area near the stocker.

As explained, when the stocker and lift are provided in the air returning area 17, the degree of freedom of the transfer route in the air returning area 17 is rather reduced but the degree of freedom of the transferring method can be increased so that the precursors may be stored in the stocker as required. Particularly, many transfer patterns may be obtained by selectively using the lift 26 on the floor and the lift and stocker of the air returning area 17 and thereby adequate transfer mode may be used depending on the kind of the manufacturing facility 12.

In addition, the stocker may be placed in the manufacturing space 13 on the floor. In this case, a lift similar to the lift 26 shown in FIG. 2 is provided to the stocker in direct or to the area near the stocker. As explained above, since the stocker and lift are provided in the manufacturing space 13, a large amount of precursors can be fed at a time to the manufacturing facility 12 to enhance the transfer efficiency.

Moreover, in above embodiment, the lift is provided in separation from the transferring system 28, but the lift may be provided in direct to the transferring system. Namely, when the lift having the mechanism similar to that of the lift 26 shown in FIG. 3 is provided to the transferring system and the precursors transferred are fed by the lift in direct to the take-in mechanism 25 of the manufacturing space 13 or to the stocker, it is no longer necessary to provide the lift in the manufacturing space 13 and the degree of freedom such as layout of the manufacturing space 13 can be increased. Particularly, when the precursors are fed in direct to the take-in mechanism 25 from the lift of the transferring system, the precursors may be fed more quickly between the transferring system and the manufacturing facility and the time required by the process from transfer to the process in the manufacturing facility can be shortened.

Meanwhile, in this embodiment, the transferring system is designed to travel on the transfer route consisting of the transfer rail 29, but the present invention is not limited thereto. For example, the transferring system may be structured as the ceiling rail running type transferring system which travels under the condition that it is suspended by the rail provided, for example, to the beam 16b of the floor. In this case, it is preferable that the lift is provided on the separating floor 22 or on the floor 16 without providing in direct the lift to the transferring system in order to ease the load applied on the beam 16b.

What is claimed is:

1. A clean room comprising:

a manufacturing space;

a transfer route of a transferring system is located in an air returning area under a floor and wherein precursors are exchanged between a transferring system and the clean room via an aperture formed at the floor, and wherein an auxiliary machinery is provided in a space under the floor and said space is shielded from the air returning area.

2. A clean room for manufacturing of semiconductor device according to claim 1, wherein a stocker is disposed in said air returning area, and a lift for moving upward the precursors is adjacent the stocker.

3. A clean room for manufacturing a semiconductor device according to claim 1, wherein a stocker is located in said manufacturing space and a lift for is adjacent the stocker.

4. A clean room for manufacturing of semiconductor device according to claim 1, further comprising a lift located under said aperture.

5. The clean room of claim 4, further comprising a take-in mechanism adjacent to said lift.

* * * * *